United States Patent
Ady et al.

(10) Patent No.: US 6,215,667 B1
(45) Date of Patent: Apr. 10, 2001

(54) MOUNTING SYSTEM AND METHOD

(75) Inventors: Roger W. Ady, Chicago; Daniel Gioia, Streamwood; William R. Groves, Naperville, all of IL (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/460,137

(22) Filed: Dec. 13, 1999

(51) Int. Cl.$^7$ ........................................ H05K 5/00
(52) U.S. Cl. .................... 361/752; 361/767; 361/807; 361/808; 361/809; 361/810; 174/138 G
(58) Field of Search .................................. 361/752, 742, 361/767, 770, 807–809; 174/138 G

(56) References Cited

U.S. PATENT DOCUMENTS

| | | | |
|---|---|---|---|
| 2,414,143 | * | 1/1947 | Dunning ............................ 439/723 |
| 3,666,301 | * | 5/1972 | Jorn ................................... 403/228 |
| 4,546,408 | * | 10/1985 | Rodseth et al. .................... 361/720 |
| 4,587,377 | * | 5/1986 | Rodseth et al. .................... 174/16.3 |
| 5,671,124 | * | 9/1997 | Ho ..................................... 361/758 |
| 5,750,936 | * | 5/1998 | Wheatley et al. ................ 174/138 G |

\* cited by examiner

Primary Examiner—Jeffrey Gaffin
Assistant Examiner—Tuan Dinh
(74) Attorney, Agent, or Firm—Joanna N. Pappas; Romi N. Bose

(57) ABSTRACT

A mounting system (10) and method for adjusting the position of a PCB (14) in a housing (22) therefor is provided. An annular, stepped mounting member (16) having axially and radially spaced surface portions (19) provides predetermined positions for the PCB (14) in the housing (22) based on the size of a mounting opening (20) of the PCB (14). The PCB (14) is placed onto the mounting member (16) with those surface portions (19) that are of smaller diameter than the opening (20) fitting therethrough until the first portion (19) having a larger diameter is encountered which will be engaged against the PCB (14). In this manner, the present system (10) allows for a relatively quick and easy change to the size of the PCB mounting hole opening (20) to be made to effect a change in the PCB vertical position in the housing (22) thereby avoiding expensive and time-consuming changes that are usually required when the position of the PCB (14) needs to be changed to accommodate component reconfigurations and the like.

22 Claims, 2 Drawing Sheets

MOUNTING SYSTEM AND METHOD

FIELD OF THE INVENTION

The invention relates to a mounting system for supporting a mounting element at different predetermined positions and, more particularly, to a mounting system for a printed circuit board in a housing therefor.

BACKGROUND OF THE INVENTION

The popularity of consumer electronic devices such as portable computers, phones, pagers, organizers and the like has derived, in part, from the ability of manufacturers to provide these devices in compact forms suitable for portable use; that is, these electronic products have been reduced in size so they can be conveniently transported. In this regard, space considerations are of paramount importance in the design and assembly thereof.

One particular area where space allocation and savings are a significant consideration is in housings for printed circuit boards (PCB's) for communication products. In these as well as other electronic consumer products, the next generation for these lines are rarely any further than one or two years down the road, and numerous derivative designs typically are launched off the original platform. In addition, oftentimes changes are necessary to provide product variations that operate in different countries and/or on different infrastructures. Due to component variations between product versions, it can become necessary to move the PCB's up or down within the housing to provide the proper component clearances on the top and bottom of the final printed circuit assembly. Cycle times and development costs can become critical factors as to whether the changes associated with a different PCB placement are feasible.

Typically, stand-off bosses or bracket-type locating members are provided to which the PCB is mounted, the members being either integrally formed with the PCB housing or as separate components for being attached thereto. These types of mounting members are used to mount the PCB in a single predetermined position in the housing and thus do not allow for the height or z-axis location of the PCB to be changed without costly and time-consuming design changes (e.g. tooling changes, material scrap and/or PCB relayout activity). With distinct components, it is generally true that there is insufficient room in the housing for different types or sizes of bosses or brackets to be attached in the housing for changing the position of the PCB without complicated redesign and/or relayout of the internal configuration of the various housed components.

In PCB modules, such as those used for RF products, the module housing is designed to be placed in an outer housing of a host device. These modules generally have a very low profile with a height or thickness in the z-direction on the order of approximately one-inch. The PCB used in these modules can be located intermediate the upper and lower covers of the module leaving approximately ¼" above and below the PCB for the module components such as where the PCB is two-sided with circuit patterns on both upper and lower surfaces thereof. To lower costs for the PCB as by only etching a circuit pattern on one side thereof and assemble and test components placed on that side, i.e. the PCB upper surface, requires that there be more room for the components above the PCB upper surface; thus, the position or height of the PCB in the module has to be lowered such as to provide ¾" of clearance above the PCB between its upper surface and the upper cover of the module. To change the PCB position in narrow width modules such as for populating only one side or the other of a PCB with components, either the mounting standoffs or the configuration of the module housing itself has to be changed including the considerable expense associated with both options. Changing the standoffs without changing the housing may not be practical or possible due to the tight clearances present in module housings.

When the PCB mounting arrangement is too complicated to change, expensive redesigns of the configuration of the housing are necessary to allow the PCB position to be adjusted such as where the original circuitry design or platform is to be maintained in the product, albeit used with different components, as previously described. To redesign the housing requires that its tooling be revamped or replaced which can be very time consuming and expensive. In today's market place, undue time delays in bringing these derivative products to the consumers is highly undesirable given the aggressive time-to-market goals typically present. In addition, oftentimes altering the configuration of the housing is not an option. This is because the outer housing dimensions are usually fixed by standard form factors such as the PCMCIA or Device Bay specification, leaving only the internal configuration of the various components to be modified to accommodate the required adjustments to the position of the PCB. Where the product utilizes more than one PCB, the above-noted problems are exacerbated, especially where it is desired to adjust the position of both boards in a housing. A further complicating factor in changing the position and thus the mounting of a PCB is the need to pass the vibration and shock tests to which the mounting system will be subjected so that for every different configuration, in addition to the costs associated with redesigning and retooling for these changes, there is the need to undergo additional rounds of testing for each subsequent product version.

Accordingly, there is a need for a mounting system that allows for adjustments to be made in the position of a element, e.g. printed circuit board, supported thereby with a minimum of time and expense. In particular, a mounting system for a printed circuit board is needed where changes in the position of the PCB can be made in a relatively quick and easy, low-cost manner without necessitating changes to the mounting standoffs and/or the configuration of the housing containing the PCB.

DETAILED DESCRIPTION OF THE PREFERRED EMBODIMENTS

Figure 1:
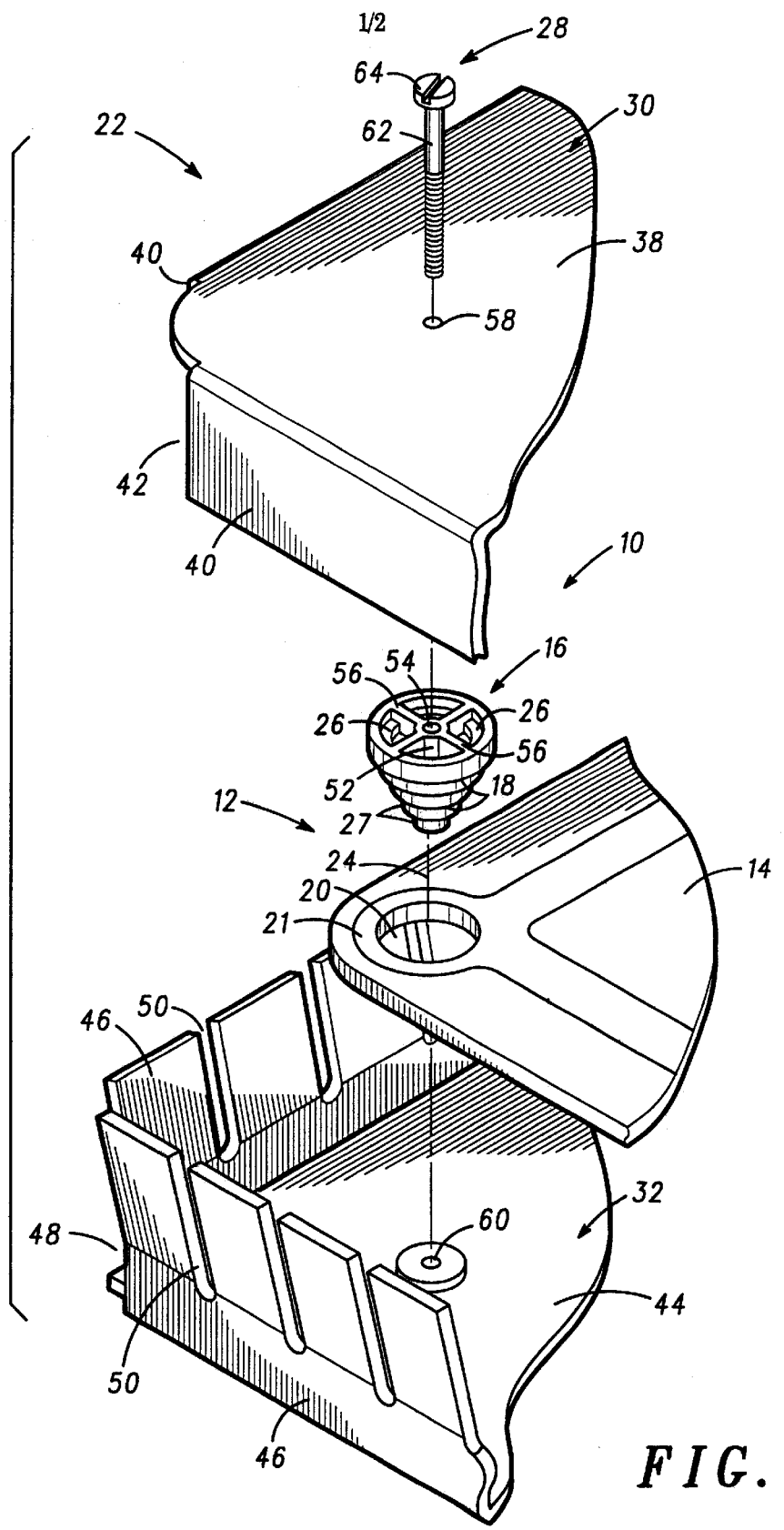
FIG. 1 is an exploded perspective view of a mounting system in accordance with the invention showing a mounting member having a plurality of mounting surfaces and a PCB including a mounting hole thereof with the opening sized to fit edges thereabout against one of the mounting surfaces.

The present invention is directed to a mounting system 10 for a mounted element 12, finding particular utility where the mounted element 12 is a panel-shaped component such as a PCB 14 as described more fully herein, although it will be recognized that the adjustable mounting concept provided by the mounting system 10 could be utilized with other types of mounted elements.

In particular, the mounting system 10 includes a mounting member 16 having a plurality of mounting surfaces, generally designated 18, against which the PCB 14 can be engaged with the particular surface 18 used for mounting the PCB 14 selected by adjusting the size of a through opening 20 therein. Accordingly, by changing the size of the opening 20, the position of the PCB 14 in a housing 22 therefor will likewise be changed. In this manner, the present mounting system 10 does not have to be changed to adjust the position of the PCB 14 within the housing 22. Importantly, the PCB housings 22 and/or host housings 34 therefor, as described more fully hereinafter, can also be maintained in their predetermined configuration, which can be of particular significance with housings for computers where the size of slots and bay openings are dictated by international standards bodies.

Accordingly, instead of costly and time consuming reconfigurations of the electronic components including the PCB 14 or changing of the housing configuration which, in any event, may not be possible, the present mounting system 10 allows a simple adjustment to the size of the through hole 20 to be made for adapting the PCB 14 for engagement against one of the mounting surfaces 18 at a particular desired position within the housing 22. To this end, the mounting system 10 allows the through hole 20 to be drilled out to different diameters which, as is apparent, is significantly less expensive than retooling for different configurations of a housing 22 or the work involved in the redesign or relayout of the internal electronic components including the PCB 14. Instead, the present invention allows a simple change in drill bit size to be the only cost in making the adjustment to the position of the PCB 14 within the housing 22. At worst, should the PCB layout require modification such as due to the different sizing of the through hole 20, the PCB 14 can be respun in a matter of days as opposed to the weeks and months usually required for retooling to make a differently configured housing 22.

The mounting surfaces 18 are spaced from each other so as to define different predetermined positions of the mounted element 12. To this end, the surfaces 18 are preferably spaced in an axial or vertical direction from each other so that the element 12 can be located at different levels within the housing 22. The surfaces 18 also include portions 19 that are spaced radially or transversely to the axial direction from adjacent surface portions 19 either thereabove or therebelow. Thus, depending on the size of the PCB through opening 20, some of the surface portions 19 can fit therethrough until the first surface portion 19 that is larger in size than the through opening 20 is engaged against edges 21 about the opening 20. It is at this first larger surface portion 19 that the predetermined position of the element 12 is defined, as will be more fully described hereinafter.

Figure 2:
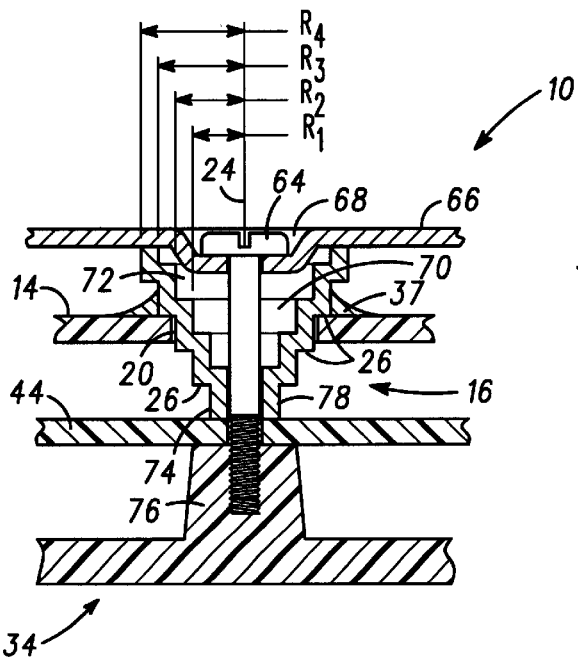
FIG. 2 is a sectional view of the mounting system of FIG. 1 shown in assembled form including an alternative hollow mounting member to allow a fastener member used therewith to seat in a recess of a housing therefor.
Figure 3:
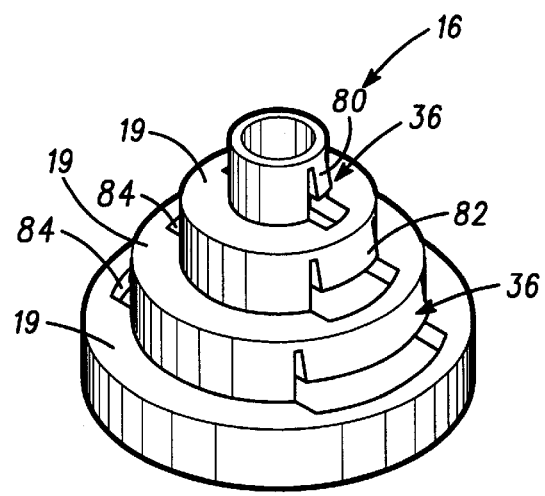
FIG. 3 is a perspective view of an alternative mounting member including capturing portions associated with each of the mounting surfaces for snap-fitting of the PCB thereagainst.

In the illustrated form, the mounting member 16 has a stepped, annular configuration about axis 24 thereof for fitting in and through a cylindrical shaped mounting opening 20 with the axis 24 centered in the opening 20, as shown in FIGS. 1–3. Each of the mounting surfaces 18 can be an annular shoulder surface portion 19 provided on a different step 26 of the mounting member 16 so that the surfaces 18 are spaced along the axis 24 via vertical cylindrical wall portions 27 with the surface portions 19 each having a different predetermined radius, R, from the axis 24.

Accordingly, the mounting surfaces 18, and more specifically the annular surface portions 19 are arranged in concentric relation to each other each with different diameters thereof so that the mounting member 16 has a variable diameter along the axis 24 thereof. The annular mounting member 16 can be attached as by fastener member 28 in the form of a mounting screw to either the upper or lower covers 30 and 32 of the housing 22 with the mounting member axis 24 extending transversely thereto in the vertical or z-axis direction. In this manner, the spacing of the mounting surfaces 18 along the z-axis 24 provides height adjustment for the PCB 14 within the housing 22.

The axial spacing of the surfaces 18 can be tied to the variable heights of interconnection hardware such board-to-board connectors, which are generally offered in 0.5 mm separation increments. The mounting system 10 herein allows the z-axis location in the housing 22 for the PCB 14 to be adjusted by changing the diameter of the through opening 20 as mentioned, and switching to a taller or shorter version of the same connector without requiring changes to its housing 22 and an outer or host device housing 34, such as where the housing 22 is for a module containing the PCB 14, as shown in FIG. 2.

Figure 4:
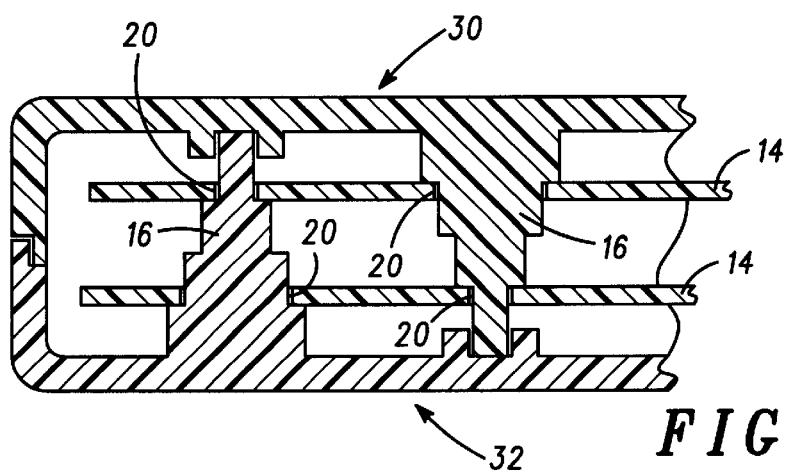
FIG. 4 is a cross-sectional view of a pair of oppositely extending integral mounting members locating and capturing a pair of PCB's in the housing.

For connecting the PCB 14 to the mounting member 16, the PCB 14 is first engaged against the desired mounting surface 18 in terms of the particular desired location or height adjusted level in the housing 22. The PCB 14 can be connected to the mounting member 16, and in particular the mounting surface 18 thereof, by soldering such as in FIG. 2, or by way of capturing portions 36 formed integrally on the mounting member 16, as can be seen in FIG. 3. Alternatively, the PCB 14 can be biased against the mounting member 16 as by a grounding spring or similar feature which may serve other purposes as well. The PCB 14 could also be held against the mounting member 16 as by mounting members 16 placed on either side over and below the PCB 14 in different through openings 20 formed therein (FIG. 4). In this instance, adjusting the height level of the PCB 14 in the housing 22 would require changing the size of both of the holes 20 in an inverse relation to each other; in other words, a first opening 20 associated with a first mounting member 16 could either be enlarged or reduced to change the mounting surface 18 against which the PCB 14 is abutted while the second mounting opening 20 associated with the second mounting member 16 would be enlarged if the first opening 20 was reduced and reduced if the first mounting opening 20 was enlarged to accommodate the changed position of the PCB 14 relative to the first mounting member 16. As shown in FIG. 4, where a pair of PCB's 14 are mounted to the members 16, adjusting the sizing of their respective openings 20 will effect a change in the relative z-axis spacing therebetween.

For soldering the PCB to the mounting member 16, either the mounting member surfaces 18 or the PCB 14 can be coated with a layer of solder material thereon. As shown in FIG. 1, the PCB edges 21 about mounting hole 20 are provided with a pad of solder material, and the mounting member 16 can be a die cast or screw machine part formed of a zinc coated alloy material. In practice, the mounting member 16 can be inserted into the mounting opening 20 in the PCB 14 to varying depths depending on the diameter thereof in an automated assembly process by a factory's high-speed PCB pick and place assembly equipment. Thereafter, the mounting member 16 is reflow soldered to the PCB 14 to provide a soldered attachment 37 therebetween.

With the mounting member 16 soldered to the PCB 14, the upper and lower covers 30 and 32 can then be snap-fit together over the PCB 14 and screwed down via screw fastener member 28 through the mounting member 16 to complete the assembly. In this regard, the upper cover 30 can have an upper wall portion 38 having side wall portions 40 depending from the periphery thereof with corner gaps 42 formed between adjacent side wall portions 40. The bottom cover 32 can be similarly constructed with a lower wall portion 44 that extends substantially parallel to the wall portion 38 of the upper cover 30 and including side wall portions 46 which project upwardly from about the periphery thereof. In addition to corner gaps 48 provided between adjacent side wall portions 46, the side wall portion 46 can be provided with slots 50 opening to the upper edge of the side walls portions 46 for providing them with flexibility to form the snap-fit connection between the upper and lower covers 30 and 32. Manifestly, the above-described construction for housing 22 can vary widely without departing from the present invention.

Referring to more of the details as shown in FIG. 1, the mounting member 16 has a center cylindrical wall 52 about axis 24 and defining a screw receiving bore 54 therethrough. The cylindrical wall 52 can be connected to the steps 26 via the integral radial webs 56 projecting outwardly therefrom. Screw holes 58 and 60 are provided in the upper wall portion 38 and lower wall portion 44, respectively, so that they are aligned with each other in the z-axis direction when the housing upper and lower covers 30 and 32 are snap-fit together. The mounting member 16 can be disposed in the housing 22 so that its screw receiving bore 54 is aligned with the screw holes 58 and 60 to allow the screw fastener member 28 to be inserted therethrough to complete the assembly. The screw fastener 28 draws the PCB 14 and the selected mounting surface 18 based on sizing of the PCB mounting opening 20 into tight engagement with each other as by cooperating threads on shank 62 of the screw 28 and in either one or both of the screw holes 58, 60. As is apparent, inserting fastener 28 through a hole such as provided by cylindrical wall 52 of mounting member 16 is not necessary as the mounting member 16 can be located or attached separately or by other means in the housing 22 such as by being integrally formed with either the upper or lower housing cover portions 30 and 32 thereof (FIG. 4) or by being glued into place using an adhesive. As shown in FIG. 4, the integral mounting member 16 can have a solid construction to facilitate manufacture thereof.

When assembled, the screw fastener 28 as inserted through the mounting member bore 54 will have its enlarged head 64 seated against the exterior of one of the upper and lower housing cover portions 30 and 32. Referencing FIG. 2, the screw head 64 is shown seated so that it is flush with external surface 66 of the upper cover 30. In this regard, the upper wall portion 38 of the cover 30 is provided with a recess 68 in which the screw head 64 is seated. To accommodate the recess 68, the mounting member 16 can be provided with a hollow internal space 70 as opposed to including the cylindrical wall 52 and radial webs 56, as in the mounting member 16 depicted in FIG. 1. In this manner, the recess 68 can project into the internal space 70 at large diameter end 72 of the member 16 with the screw shank 62 extending therethrough. FIG. 2 shows the arrangement of the PCB module housing 22 attached in the host device housing 34, as previously mentioned. For this purpose, the screw shank 62 can be of sufficient length so that it projects through both small diameter end 74 of the mounting member 16 and lower cover opening 60, and into a raised screw receiving boss 76 of the host device housing 34 for securing the PCB module 22 thereto.

Continuing reference to FIG. 2, the axial length of the mounting member 16 between ends 72 and 74 thereof can span the distance between the upper and lower wall portions 38 and 44 of the housing 22. As shown, the hollow mounting member 16 is provided with four steps 26 and corresponding mounting surface portions 19 thereon having different predetermined radii, $R_1$ through $P_4$. Manifestly, the number, spacing and sizing of the steps 26 can be varied such as based on the dimensions of the PCB 14 and/or the housings 22 and 34.

As shown, the mounting member 14 has a cylindrical lead-in portion 78 at end 74 thereof abutted against the lower cover portion 44 with the radii, $R_1$ through $R_4$, progressively increasing in size from small diameter end 74 to large diameter end 72 thereof. As illustrated, the radius of the cylindrical mounting hole 20 is sized to be slightly greater than the radius, $R_2$, and slightly less than the radius, $R_3$, so that the PCB 14 seats against the larger mounting surface portion 19, i.e. that sized with the predetermined radius, $R_3$. In this regard, the surface portion 19 sized with the predetermined radius, $R_4$, is disposed above the PCB 14, while the mounting member lead-in portion 78 and the mounting surface portions 19 sized with radii, $R_1$ and $R_2$, are disposed below the PCB 14 having been inserted through the mounting opening 20 thereof. The present mounting member 16 allows PCB suppliers to form the openings 20 with predetermined diameters that will correspond to a particular height level along the axis 24 of the member 16 based on the axial position of the surface portion 19 to be engaged for holding the PCB 14 thereat.

As previously discussed, alternatively the PCB 14 can be attached to the mounting member 16 by way of capturing portions 36. The capturing portions 36 are associated with each of the mounting surface portions 19 and operate to capture the PCB 14 thereagainst. The capturing portions 36 can be integrally formed with the mounting member 16 on the wall portions 27 thereof and spaced above the associated mounting surface portions 19, as shown. A pair of diametrically opposed capturing portions 36 can be associated with each surface portion 19. The capturing portions 36 are each provided with a cam surface 80 inclined at a slight angle from the mounting member axis 24 meeting with a flat surface 82 at the bottom thereof that extends transversely to the axis 24 and in confronting, substantial parallel relationship to the mounting surface portions 19 to provide the capturing portions 36 with a wedge shape. The distance between the surface portions 19 and the surfaces 82 of the associated capturing portions 36 is approximately the same as the thickness of the PCB 14 to provide a tight fit therebetween.

In this manner, when the PCB 14 is dropped onto the mounting member 16, the edges 21 about the mounting opening 20 resiliently engage and cam against the inclined cam surface 80 of the wedge-shaped capturing portion 36 associated with the surface portion 19 to be abutted against the PCB 14. Once the edges 21 clear the juncture of the capturing portions surfaces 80 and 82, the PCB 14 will be held tightly by the capturing portion surface 82 at one side and the mounting surface portion 19 on the other side thereof.

The mounting member 16 including the capturing portions 36 can be an injection molded piece of a plastic such as Ryton that can withstand solder reflow temperatures without deforming and be provided in a tape and reel package so that they can be machine placed on the front end of the factory assembly line. As the PCBs 14 are typically of a relatively thin, fiberglass composite material, either one or both the PCB 14 and the plastic capturing portions 36 can resiliently deflect until the PCB 14 is abutted and captured against the desired mounting surface portion 19 based on the sizing of the through hole 20, as previously discussed. To further enhance the mechanical lock or clamping obtained between the capturing portions 36 and the associated surface portions 19, the mounting members 16 can include openings 84 formed in the surface portions 19 disposed immediately below the capturing portions 36. More specifically, the openings 84 can extend from the inner diameter of the annular mounting surface portions 19 and extend radially outward stopping short of the outer diameter of the mounting surface portions 19 and extending circumferentially to the same extent or slightly beyond the capturing portions 36 thereabove. The sizing of the distance between the capturing portions flat surfaces 82 and the associated mounting surface portions 19 can be such that when the PCB 14 is snapped into place therebetween, the PCB 14 will be biased into the openings 84. In this manner, the PCB 14 is restricted against movement in both the vertical or z-axis direction as well as laterally, transverse to the z-axis by having the portions of the PCB 14 aligned over the openings 84 biased therein.

Once the PCB 14 is held in place against the surface portion 19 by the associated capturing portions 36, the aforedescribed fastener member 28 such as in the form of a shoulder bolt can have its shank 62 extending through the mounting member 16 so that the shank 62 is closely adjacent the interior side of wall 27 of the member lead-in portion 78. Alternatively, a pin (not shown) that is press fit, welded, integral with or otherwise attached in the housing 22 could be utilized to locate the member 16 therein. The shank 62 of the fastener member or pin so disposed in the mounting member 16 will provide it with stiffness so as to resist shifting of the mounting member 16, and particularly walls 27 including the capturing portions 36 thereon. In this manner, once the PCB 14 is snapped into place on the mounting member 16 via the capturing portions 36 associated with the surface portion 19 against which it is held, the PCB 14 will be kept securely locked as insertion of the shank 62 through the mounting member 16 will limit the ability of the capturing portions 36 to shift or deflect from their locked position such as due to shock loads or vibrations that may otherwise tend to create forces pushing the PCB 14 off the surface portion 19 and against the capturing portions 36 associated therewith.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

What is claimed is:

1. A mounting system for supporting a mounted element having a mounting opening at different predetermined positions, the mounting system comprising:
   a mounting member extending along an axis thereof; and
   a plurality of steps of the mounting member each including a shoulder surface completely axially spaced from other shoulder surfaces for defining the different positions at which the mounted element can be supported by the mounting member and each extending for a distance transverse to the axis different from that to which the other shoulder surfaces extend to allow changes in size of the mounting opening to dictate the shoulder surface against which the mounted element will be engaged.

2. The mounting system of claim 1 wherein the mounting surfaces are concentric, annular surfaces spaced from each other so that the annular surfaces become progressively larger from one end of the mounting member to an opposite end thereof to allow the mounted element to be engaged against a particular one of the surfaces depending on the size of a mounting opening therein.

3. The mounting system of claim 1 wherein the mounting member comprises a pair of mounting members that engage via respective surfaces thereof against opposite sides of the mounted element for holding the mounted element in place.

4. The mounting system of claim 1 in combination with the mounted element which comprises a printed circuit board mounted to one of the plurality of surfaces of the mounting member.

5. The mounting system of claim 1 wherein the surfaces include a material that can form a solder connection with the mounted element.

6. The mounting system of claim 1 wherein the mounting member includes capturing portions associated with each of the surfaces to substantially fix the mounted element thereagainst.

7. A mounting system for allowing printed circuit boards to be mounted in different predetermined positions in a housing having a predetermined configuration, the mounting system comprising:
   a mounting member extending along an axis thereof;
   substantially flat mounting surfaces of the mounting member extending generally normal to the axis that are spaced from each other along the axis to allow a printed circuit board to be positioned flush against the flat, mounting surfaces at different axial levels along the mounting member; and
   portions of each of the mounting surfaces that are spaced transversely relative to the axis from adjacent mounting surface portions along the axis so that by sizing a mounting hole of the printed circuit board to a particular diameter, the mounting member can fit through the mounting hole until the printed circuit board is engaged against one of the transversely spaced portions at one of the different predetermined positions in the housing keeping the housing predetermined configuration the same.

8. The mounting system of claim 7 wherein the mounting member has a predetermined annular configuration with the mounting surface portions having different predetermined radii from the axis so that the surfaces are spaced transversely relative to each other.

9. The mounting system of claim 7 wherein the mounting surfaces have an annular configuration each with a different predetermined diameter so that mounting holes of printed circuit boards can be formed to cooperate with the predetermined diameter of one of the annular mounting surfaces to mount the printed circuit board at a specific level in the housing corresponding to the position of the one surface along the mounting member axis.

10. The mounting system of claim 7 wherein the mounting member is one of integrally connected to the housing and a distinct component attached in the housing.

11. The mounting system of claim 7 wherein the housing and the mounting member include aligned through holes for receiving a fastener member therethrough and through a mounting hole of the printed circuit board to clamp the printed circuit board to the mounting member against one of the surface portions thereof in a corresponding one of the different positions in the housing.

12. The mounting system of claim 7 wherein the mounting surfaces comprise at least three different surfaces to provide three different predetermined positions for the circuit board in the housing.

13. The mounting system of claim 7 wherein the mounting surface portions include a material that can form a solder connection to printed circuit boards.

14. The mounting system of claim 7 wherein the mounting member includes capturing portions associated with each of the mounting surfaces for capturing the printed circuit board against the one mounting surface portion to substantially resist shifting of the printed circuit board when the housing is exposed to shock loads and vibrations.

15. A mounting system comprising:
   a housing;
   a substantially annular mounting member in the housing extending along an axis with a variable diameter therealong; and
   a printed circuit board including a mounting opening sized to allow a portion of the mounting member to be fit therethrough and to be held in a predetermined position thereby, with the opening and mounting member cooperating so that adjustments to the size of the opening changes the predetermined position of the printed circuit board in the housing along the mounting member axis in a predetermined manner.

16. The mounting system of claim 15 wherein the mounting member includes a plurality of surfaces spaced along the axis and radially out therefrom with the surfaces defining predetermined positions for the printed circuit board corresponding to predetermined sizes of the mounting opening.

17. The mounting system of claim 15 wherein the housing includes upper and lower wall portions and the mounting member is disposed in the housing with the axis thereof arranged vertically, transverse to the upper and lower wall portions so that the mounting member allows the height of the printed circuit board in the housing to be adjusted.

18. A method for mounting a printed circuit board in a housing at different predetermined positions therein, the method comprising:
   providing a mounting member in the housing having a plurality of spaced mounting surfaces thereon;
   sizing a mounting opening in the printed circuit board to fit against one of the spaced mounting surfaces;
   sliding the mounting member transversely to the printed circuit board aligned with the mounting opening thereof;
   engaging the one mounting surface against edges about the mounting opening; and
   attaching the printed circuit board to the one engaged mounting surface at one of the different predetermined positions in the housing defined by the position of the one surface.

19. The method of claim 18 wherein the mounting member is slid so that another one of the mounting member surfaces is disposed on one side of the printed circuit board mounting opening or in the opening and the one surface is one the other side of the opening engaged against the printed circuit board.

20. The method of claim 18 wherein first and second mounting members are provided on either side of the printed circuit board with one of the mounting surfaces of each engaged against edges about respective first and second mounting openings in the printed circuit board, and
   changing the predetermined position at which the printed circuit board is mounted in the housing by one of increasing and decreasing the sizing of the first mounting opening and the other of increasing and decreasing the sizing of the second mounting opening in the printed circuit board.

21. The method of claim 20 wherein a pair of printed circuit boards are provided each having first and second mounting openings with edges engaged against mounting surfaces of said first and second mounting members, and
   changing the predetermined positions of the printed circuit boards relative to each other in the housing by the selective sizing of the mounting openings thereof.

22. The method of claim 18 wherein the mounting member includes capturing portions associated with the mounting surfaces, and the printed circuit board is attached to the one surface by sliding the printed circuit board against a cam surface of the associated capturing portion and snap-fitting the capturing portion against the circuit board as it slides past the capturing portion.

* * * * *